(12) United States Patent
Lee

(10) Patent No.: US 8,441,027 B2
(45) Date of Patent: May 14, 2013

(54) LIGHT EMITTING DEVICE AND LIGHT EMITTING DEVICE PACKAGE

(75) Inventor: Chang Bae Lee, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 118 days.

(21) Appl. No.: 12/945,360

(22) Filed: Nov. 12, 2010

(65) Prior Publication Data

US 2011/0140153 A1    Jun. 16, 2011

(30) Foreign Application Priority Data

Dec. 10, 2009   (KR) .................. 10-2009-0122753

(51) Int. Cl.
*H01L 33/00* (2010.01)

(52) U.S. Cl.
USPC ............... 257/98; 257/13; 257/79; 257/88; 257/E21.006; 257/E21.053; 257/E21.054; 257/E21.17; 257/E21.214; 257/E21.229; 257/E21.352

(58) Field of Classification Search .......... 257/13, 257/77, 78, 79, 88, 98, 199, 200, 201, E21.006, 257/E21.053, E21.054, E21.17, E21.218, 257/E21.229, E21.231, E33.064
See application file for complete search history.

(56) References Cited

U.S. PATENT DOCUMENTS

| 7,732,802 B2 * | 6/2010 | Cho et al. .................. 257/13 |
| 2007/0036189 A1 * | 2/2007 | Hori et al. .................. 372/50.11 |
| 2008/0251803 A1 | 10/2008 | Cho et al. .................. 257/94 |
| 2009/0267098 A1 | 10/2009 | Choi |
| 2010/0102351 A1 | 4/2010 | Kim et al. .................. 257/98 |

FOREIGN PATENT DOCUMENTS

| EP | 1 555 686 A2 | 7/2005 |
| JP | 2009-152334 A | 7/2009 |
| KR | 2007-0018212 | 2/2007 |
| KR | 2008-0069766 | 7/2008 |
| KR | 10-2008-0088278 A | 10/2008 |
| KR | 10-2008-0093222 A | 10/2008 |
| KR | 2009-0010621 | 1/2009 |
| KR | 10-0916375 B1 | 9/2009 |
| WO | WO 2007/001141 A1 | 1/2007 |
| WO | WO 2010/110608 A2 | 9/2010 |

OTHER PUBLICATIONS

Korean Office Action dated Dec. 8, 2010 issued in Application No. 10-2009-0122753.
European Search Report dated Mar. 9, 2011 issued in Application No. 10 19 1492.
Korean Notice of Allowance dated Mar. 29, 2011 issued in Application No. 10-2009-0122753.

* cited by examiner

*Primary Examiner* — David Nhu
(74) *Attorney, Agent, or Firm* — KED & Associates, LLP

(57) ABSTRACT

Disclosed are a light emitting device and a light emitting device package. The light emitting device includes a substrate including a plurality of patterns, each pattern including three protrusion parts, a plurality of spaces formed between the patterns, and a light emitting device structure over the patterns and the spaces. Each space includes a medium having a refractive index different from a refractive index of the light emitting device structure.

26 Claims, 7 Drawing Sheets

LIGHT EMITTING DEVICE AND LIGHT EMITTING DEVICE PACKAGE

The present application claims priority under 35 U.S.C. 119(a) of Korean Patent Application No. 10-2009-0122753 filed on Dec. 10, 2009, which is hereby incorporated by reference in its entirety.

BACKGROUND

The embodiment relates to a light emitting device and a light emitting package.

A light emitting diode (LED) is a semiconductor light emitting device that converts current into light. The LED can generate light having high brightness, so that the LED has been expensively used as a light source for a display device, a vehicle, or a lighting device. In addition, the LED can represent a white color having superior light efficiency by employing phosphors or combining LEDs having various colors.

In order to improve the brightness and the performance of the LED, various attempts have been performed to improve a light extracting structure, an active layer structure, current spreading, an electrode structure, and a structure of a light emitting diode package.

SUMMARY

The embodiment provides a light emitting device having a new structure.

The embodiment provides a light emitting device capable of improving the reliability and the quality.

The embodiment provides a light emitting device capable of remarkably improving light extraction efficiency.

The embodiment provides a light emitting device capable of obtaining uniform light extraction efficiency.

The embodiment provides a light emitting device package including the light emitting device.

A light emitting device comprises: a substrate including a plurality of patterns, each pattern including a plurality of protrusion parts; a plurality of spaces between the patterns; and a light emitting device structure including a first semiconductor layer, an active layer, and a second semiconductor layer over the patterns and the spaces, wherein each space includes a medium having a refractive index different from a refractive index of the light emitting device structure A light emitting device comprises: a substrate; and a plurality of patterns arranged over the substrate, wherein each pattern comprises: a plurality of protrusions protruding in horizontal directions different from each other; a plurality of spaces formed among the patterns; and a light emitting device structure including a first semiconductor layer, an active layer, and a second semiconductor layer over the patterns and the spaces, and wherein each space includes a medium having a refractive index different from a refractive index of the light emitting structure, and one protrusion part of one pattern among the patterns forms one space together with two protrusion parts of another pattern.

A light emitting device package comprises: a body; first and second electrode layers over the body; a light emitting device electrically connected to the first and second electrode layers over the body; and a molding member surrounding the light emitting device over the body, wherein each light emitting device comprises: a plurality of patterns, each pattern including a plurality of protrusion parts; a plurality of spaces formed between the patterns; and a light emitting structure including a first semiconductor layer, an active layer, and a second semiconductor layer over the patterns and the spaces, and wherein each space includes a medium having a refractive index different from a refractive index of the light emitting structure.

The light emitting device package according to the embodiment includes at least the light emitting device.

The display device according to the embodiment includes at least the light emitting device package.

The lighting device according to the embodiment includes at least the light emitting device package.

DETAILED DESCRIPTION OF THE EMBODIMENTS

Figure 1:
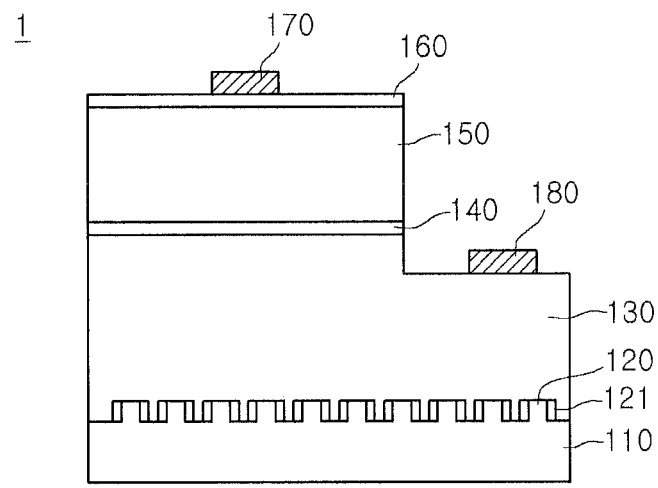
FIG. 1 is a sectional view showing a light emitting device according to the embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Hereinafter, embodiments will be described with reference accompanying drawings. The thickness and size of each layer shown in the drawings may be exaggerated, omitted or schematically drawn for the purpose of convenience or clarity. In addition, the size of elements does not utterly reflect an actual size.

FIG. 1 is a sectional view showing a light emitting device 1 according to the embodiment.

Referring to FIG. 1, the light emitting device 1 includes a substrate 110 provided with a plurality of branch-type patterns 120, spaces 121 formed between the branch-type patterns 120, a first semiconductor layer 130 over the substrate 110, an active layer 140 over the first semiconductor layer 130, a second semiconductor layer 150 over the active layer 140, a transparent electrode layer 160 over the second semiconductor layer 150, a first electrode 170 over the transparent electrode layer 160, and a second electrode 180 over the first semiconductor layer 130.

The minimum light emitting structure of emitting a light can be defined by the first semiconductor layer 130, the active layer 140, and the second semiconductor layer 150.

The substrate 110 and the branch-type patterns 120 may include at least one selected from the group consisting of $Al_2O_3$, SiC, Si, GaAs, GaN, ZnO, Si, GaP, InP, and Ge.

After forming a mask layer including a plurality of patterns over the substrate 110, the branch-type patterns 120 may be formed through a dry etching process such as a (RIE) reactive ion etching or ICP (inductive coupled plasma) by dry etching equipment using the patterns of the mask layer as a mask, but the embodiment is not limited thereto.

Figure 2:
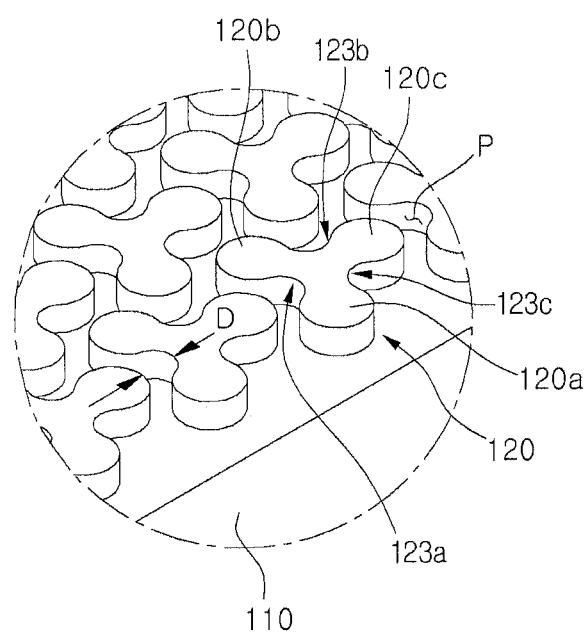
FIG. 2 is a view showing the patterns of FIG. 1.
Figure 3:
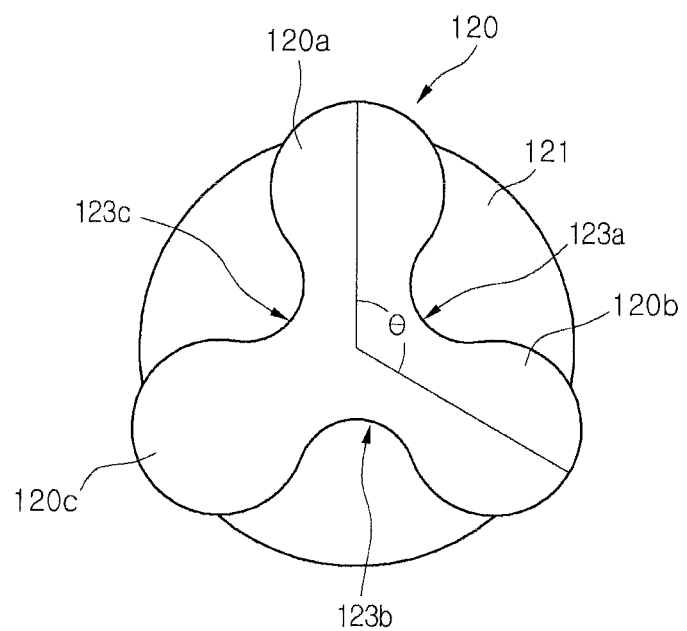
FIG. 3 is a view showing the patterns of FIG. 2 in detail.

Referring to FIGS. 2 and 3, the branch-type patterns 120 may include at least three protrusion parts 120a, 120b, and 120c. The branch-type patterns 120 may include three protrusion parts, four protrusion parts, five protrusion parts, or more, but the following description will be made while focusing on three protrusion parts 120a, 120b, and 120c. The first to third protrusion parts 120a, 120b, and 120c may protrude in three different horizontal directions from one point (branch point) positioned at the center of the first to three protrusion parts 120a, 120b, and 120c. The first to third protrusion parts 120a, 120b, and 120c may include the same material as that of the substrate 110, and may be formed from the substrate 110. The first to third protrusion parts 120a, 120b, and 120c have end portions with a rounded convex shape, but the embodiment is not limited thereto. The widths of the first to third protrusion parts 120a, 120b, and 120c in the vicinity of the branch point may be narrower than the widths of the end portions. Accordingly, first to third grooves 123a, 123b, and 123c may be formed among the first to third protrusion parts 120a, 120b, and 120c in the vicinity of the branch point. The first to third grooves 123a, 123b, and 123c may have a rounded concave shape. The first groove 123a may be formed between the first and second protrusion parts 120a and 120b, the second groove 123b may be formed between the second and third protrusion parts 120b and 120c, and the third groove 123c may be formed between the first and second protrusion parts 120a and 120c. The branch-type patterns 120 may have various modifications in shape, but the embodiment is not limited thereto.

The first to third protrusion parts 120a, 120b, and 120c may have the same length or different lengths. In addition, the minimum angle (θ) among angles formed between two adjacent protrusion parts of the first to third protrusion parts 120a, 120b, and 120c is equal to or less than 120°, but the embodiment is not limited thereto.

The end portion of one of the first to third protrusion parts 120a, 120b, and 120c of the branch-type pattern 120 may be disposed at position near one groove of the first to third grooves of another branch-type pattern adjacent to a branch-type pattern 120.

The spaces 121 may be formed with a predetermined distance between the branch-type patterns 120. For example, the end portion of a protrusion part of the branch-type pattern 120 may be inserted into a groove of an adjacent branch-type pattern 120 while being spaced apart from the groove at a predetermined distance D, or the end portion of a protrusion part of the adjacent branch-type pattern 120 may be inserted into a groove of the branch-type pattern 120 while being spaced apart from the groove at the distance D. However, the embodiment is not limited thereto.

In addition, the distance D between the branch-type patterns 120 may not have a predetermined distance. In other words, if the distance D between the branch-type patterns 120 is within the range to form the spaces 121, the distance D between the branch-type patterns 120 may not be constant.

One space may be defined by one protrusion part of one branch-type pattern 120 and two protrusion parts of another branch-type pattern 120. For example, if the branch-type pattern 120 has five protrusion parts, five spaces may be formed in the vicinity of the branch-type pattern 120 by protrusion parts of branch-type patterns adjacent to the five protrusion parts of the branch-type pattern 120, but the embodiment is not limited thereto.

The branch-type patterns 120 may be arranged on the substrate 110 in a matrix shape defined by column and row directions. For example, the distance D may be in the range of about 0.1 μm to about 1 μm. If the distance D is less than or equal to 0.1 μm, or greater than or equal to 1 μm, the first semiconductor layer 130 is filled in the space between the first to third protrusion parts 120a, 120b, and 120c, so that the space 121 of confining air may be not formed. The refractive index of air is about 1, but the refractive index of the light emitting structure, especially, the first semiconductor layer 130 may be about 2.33. Therefore, the refractive index of the light emitting structure is different from the refractive index of the air. In this case, the space 121 reduces a critical angle at which an incident light emitted from the active layer 140 to the space 121 through the first semiconductor layer 130 is totally reflected, thereby reflecting the incident light at the maximum. Therefore, the light extraction efficiency can be remarkably improved.

The branch-type patterns 120 may be arranged in a zigzag shape.

In addition, the branch-type patterns 120 may be arranged in an oblique direction.

The branch-type patterns 120 may be randomly arranged.

The embodiment is not limited to the arrangement and the shape of the branch-type patterns 120. For example, the branch-type patterns 120 may be connected to each other.

The height of the space 121 may be less than or equal to the thickness of the branch-type patterns 120.

Each of the first to third grooves 123a, 123b, and 123c, which are formed among the first to third protrusion parts 120a, 120b, and 120c of the branch-type pattern 120, and the end portion of an appropriate protrusion part of another branch-type pattern may form the space 121 therebetween. The space 121 may contain air.

The end portions of the first to third protrusion parts 120a, 120b, and 120c of the branch-type pattern 120 have a rounded convex shape, the first to third grooves 123a, 123b, and 123c having a concave shape are formed between the first to third protrusion parts 120a, 120b, and 120c in the vicinity of the branch point, and the spaces 121 formed between the first to third protrusion parts 120a, 120b, and 120c of the branch-type pattern 120 and protrusion parts of adjacent branch-type pattern corresponding to the first to third protrusion parts 120a, 120b, and 120c have the distance D in the range of about 0.1 μm to about 1 μm, so that the first semiconductor layer 130 may be not grown in the space 121 when the first semiconductor layer 130 is formed. Accordingly, the air can be fully confined in the space 121.

As described above, a light incident onto the substrate 110 from the light emitting structure, especially, the active layer 140 is refracted, scattered or reflected by the space 121 filled with the air, so that the light extraction efficiency of the light emitting device 1 can be remarkably improved.

The light emitting structure including the first semiconductor layer 130, the active layer 140, and the second semiconductor layer 150 may be formed on the substrate 110.

The light emitting structure may be grown through MOCVD (Metal Organic Chemical Vapor Deposition), CVD (Chemical Vapor Deposition), PECVD (Plasma-Enhanced Chemical Vapor Deposition), MBE (Molecular Beam Epitaxy), or HVPE (Hydride Vapor Phase Epitaxy).

The first semiconductor layer 130 may include a first conductive-type semiconductor layer. Meanwhile, the first semiconductor layer 130 includes the first conductive-type semiconductor layer and a non-conductive semiconductor layer under the first conductive-type semiconductor layer, but the embodiment is not limited thereto.

For example, the first conductive-type semiconductor layer may be an N-type semiconductor layer including N-type dopants. The N-type semiconductor layer may include a semiconductor material having a composition formula of $In_xAl_yGa_{1-x-y}N$ ($0 \leq x \leq 1$, $0 \leq y \leq 1$, $0 \leq x+y \leq 1$), for example, including one selected from the group consisting of InAlGaN, GaN, AlGaN, InGaN, AlN, InN, and AlInN doped with N-type dopants such as, Si, Ge, or Sn.

Since the non-conductive semiconductor layer is not doped with conductive dopants, the non-conductive semiconductor layer has remarkably low electrical conductivity as compared with the first conductive-type semiconductor layer. For example, the non-conductive semiconductor layer may include an undoped GaN layer, but the embodiment is not limited thereto.

In addition, a buffer layer (not shown) may be formed between the first semiconductor layer 130 and the substrate 110 to reduce a lattice constant difference between the first semiconductor layer 130 and the substrate 110.

When the first semiconductor layer 130 or the buffer layer (not shown) is grown on the substrate 110, the space 121 having a size in the range of about 0.1 μm to about 1 μm is formed between the branch-type patterns 120, end portions of the first to third protrusion parts 120a, 120b, and 120c of the branch-type pattern 120 have a rounded convex shape, the first to third grooves 123a, 123b, and 123c formed between the first to third protrusion parts 120a, 120b, and 120c have a rounded convex shape, and the widths of the first to third protrusion parts 120a, 120b, and 120c in the vicinity of the branch point are narrower than those of the end portions of the first to third protrusion parts 120a, 120b, and 120c, so that the first semiconductor layer 130 or the buffer layer (not shown) cannot be easily grown in the space 121. Therefore, the air is confined in the space 121 instead of the first semiconductor layer 130.

The active layer 140 may be formed over the first semiconductor layer 130.

The active layer 140 emits a light having a wavelength corresponding to the energy band gap difference according to materials constituting the active layer 140 through the combination of electrons (or holes) injected through the first semiconductor layer 130 and holes (or electrons) injected through the second semiconductor layer 150.

The active layer 140 may have a single quantum well structure or a multi-quantum well structure, but the embodiment is not limited thereto.

A clad layer (not shown) doped with N-type dopants or P-type dopants can be formed on and/or under the active layer 140. The clad layer (not shown) may be realized by using an AlGaN layer or an InAlGaN layer.

The second semiconductor layer 150 may be formed over the active layer 140. The second semiconductor layer 150 may include a P-type semiconductor layer including P-type dopants. For instance, the P-type semiconductor layer may include a semiconductor material having the compositional formula of $In_xAl_yGa_{1-x-y}N$ ($0 \leq x \leq 1$, $0 \leq y \leq 1$, $0 \leq x+y \leq 1$). In detail, the P-type semiconductor layer may include one selected from the group consisting of InAlGaN, GaN, AlGaN, InGaN, AlN, InN, and AlInN doped with the P-type dopant such as Mg, Zn, Ca, Sr, or Ba.

The transparent electrode layer 160 may be formed over the second semiconductor layer 150. The transparent electrode layer 160 may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, Ruox, RuOx/ITO, Ni/IrOx/Au and Ni/IrOx/Au/ITO.

A reflective electrode layer (not shown) may be formed over the second semiconductor layer 150 instead of the transparent electrode layer 160. The reflective electrode layer may include at least one selected from the group consisting of Ag, Al, Pt, and Pd representing reflective efficiency.

The first electrode 170 may be formed over the transparent electrode layer 160, and the second electrode 180 may be formed over the first semiconductor layer 130. The first and second electrodes 170 and 180 supply power to the light emitting device 1.

Before the second electrode 180 is formed, a mesa etching process may be performed such that the first semiconductor layer 130 is exposed.

Hereinafter, the manufacturing process of the light emitting device 1 will be described in detail.

FIGS. 4 to 9 are sectional views showing the manufacturing process of the light emitting device 1 according to the embodiment.

Figure 4:
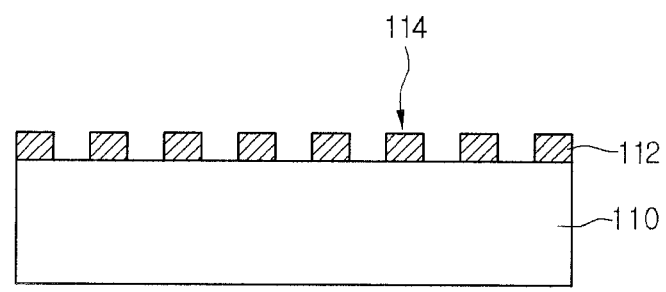
FIGS. 4 to 9 are views showing the manufacturing process of the light emitting device according to the embodiment.

Referring to FIG. 4, a mask layer 112 including a plurality of second patterns 114 may be formed over the substrate 110. The second patterns 114 may correspond to the branch-type pattern 120. The mask layer 112 may include a photoresist material, but the embodiment is not limited thereto.

The substrate 110 may include at least one selected from the group consisting of SiC, Si, GaAs, GaN, ZnO, Si, GaP, InP, and Ge.

The mask layer 112 may be formed through a photolithography process including an exposure and develop process, but the embodiment is not limited thereto.

Hereinafter, a method of manufacturing the mask layer 112 will be described.

Figure 5:
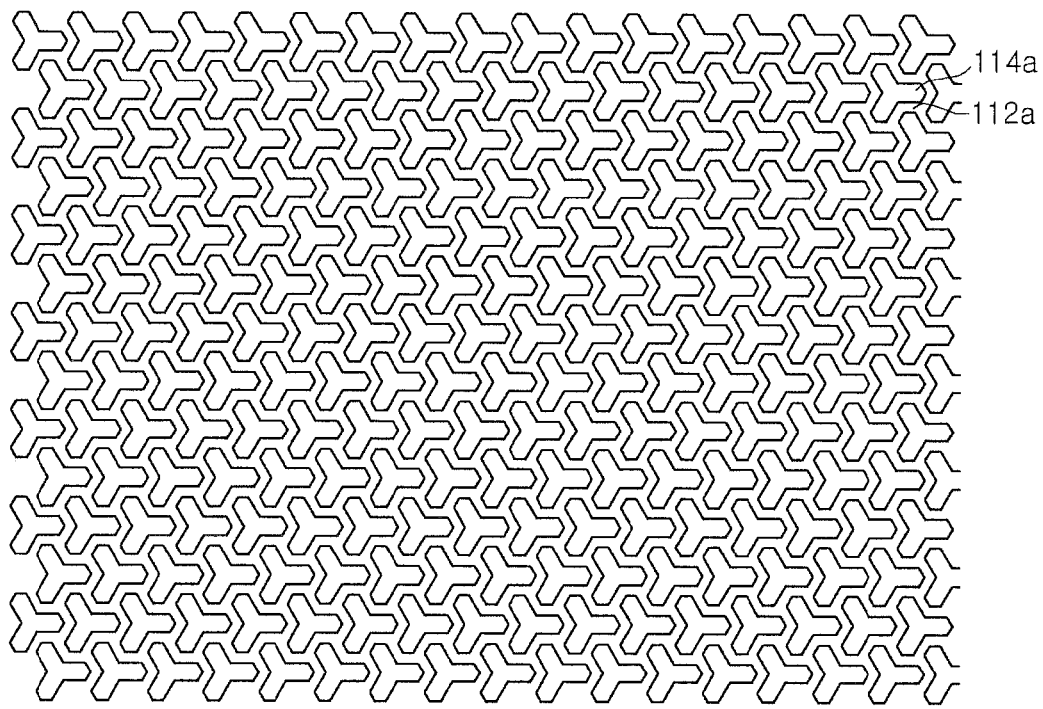

Referring to FIG. 5, a mask layer 112a having a plurality of first patterns 114a is formed over the substrate 110. Differently from the second pattern 114, the first patterns 114a have the same width in both of an end portion thereof and a portion thereof placed in the vicinity of the branch point.

Next, an exposure process is performed with respect to the mask layer 112a along the first patterns 114a. In the exposure process, the mask layer 112a may have a thickness in the range of about 3 μm to about 5 μm. Preferably, the mask layer 112a may have a thickness of 4 μm. For example, the exposure time for the exposure process may be in the range of about 250 msec to about 350 msec, and may preferably be 300 msec.

Figure 6:
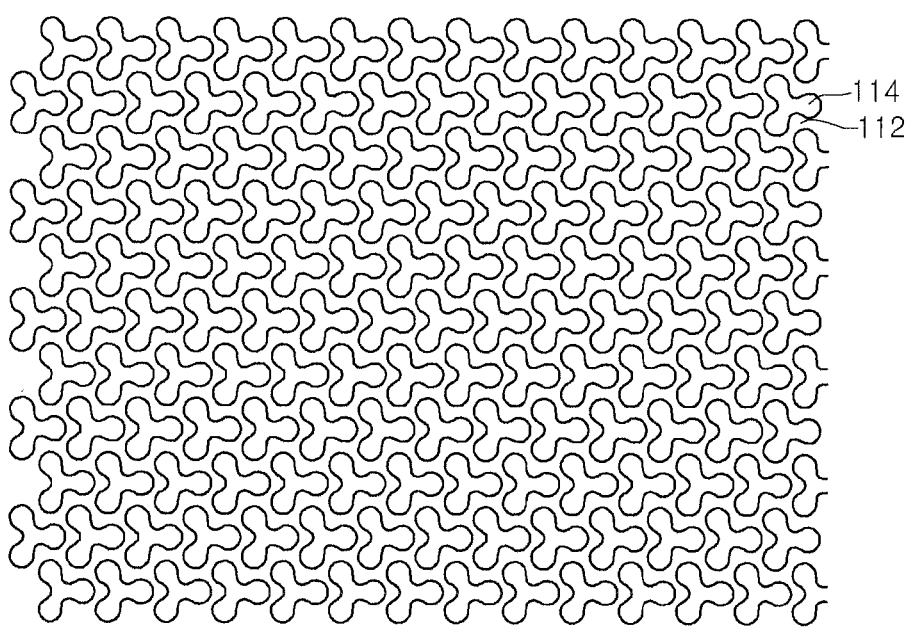

Referring to FIG. 6, a develop process is performed with respect to the mask layer 112a, so that the mask layer 112 including the second pattern 114 may be provided. The end portion of the second pattern 114 may have a rounded convex shape by the exposure process, and the portion of the second pattern 114 in the vicinity of the branch point may have a width narrower than that of the end portion of the second pattern 114.

Meanwhile, the exposure process is not essentially required to form the mask layer 112, but the embodiment is not limited thereto. For example, the mask layer 112 may be formed by a mask layer having a pattern corresponding to the second pattern 114.

Figure 7:
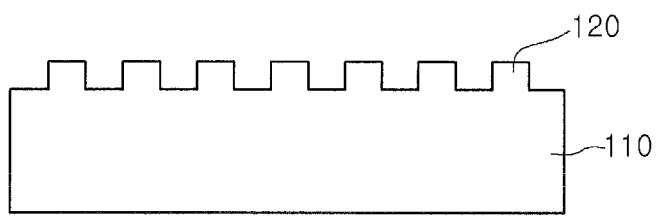
Figure 8:
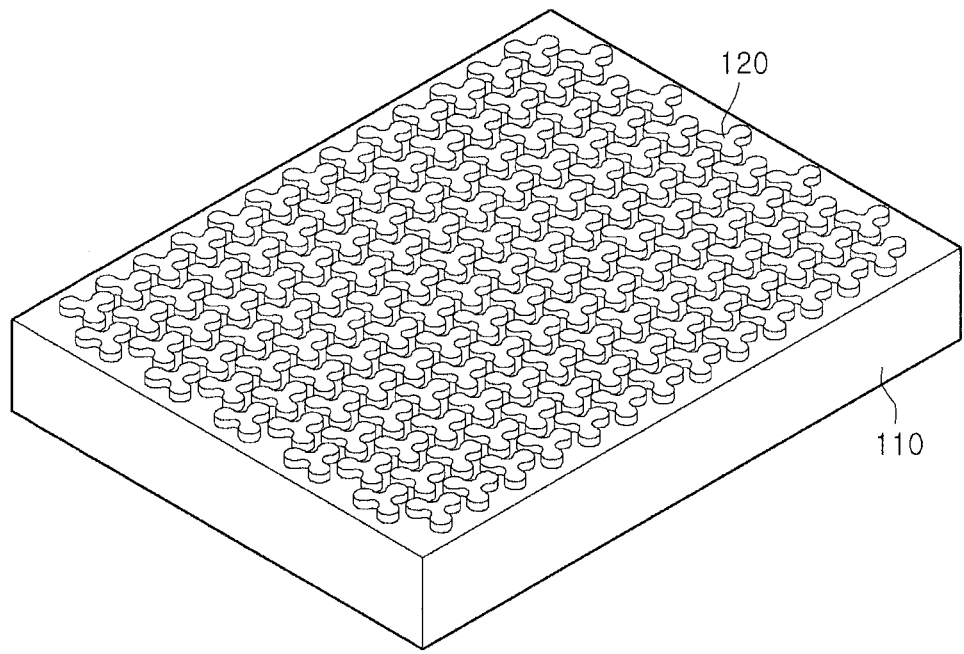

Referring to FIGS. 7 and 8, the branch-type patterns 120 may be formed over the substrate 110 through a dry etching process such as an RIE or ICP by dry etching equipment using the pattern of the mask layer 112 including the second pattern 114 as a mask. Thereafter, the mask layer 112 may be removed through a string process.

The branch-type pattern 120 may include at least the first to third protrusion parts 120a, 120b, and 120c. The end portions of the first to third protrusion parts 120a, 120b, and 120c have a rounded convex shape, and the first to third grooves 123a, 123b, and 123c formed between the first to third protrusion parts 120a, 120b, and 120c may have a rounded concave shape. In addition, the width of the portion of the branch-type pattern 120 in the vicinity of the branch point may be narrower the width of the end portions of the first to third protrusion parts 120a, 120b, and 120c.

The first to third protrusion parts 120a, 120b, and 120c may have the same length or different lengths. In addition, the minimum angle (θ) among angles formed between two adjacent protrusion parts of the first to third protrusion parts 120a, 120b, and 120c is equal to or less than 120°, but the embodiment is not limited thereto.

The branch-type patterns 120 may be arranged over the substrate 110 in a matrix shape defined by column and row directions. For example, if the distance D may be in the range of about 0.1 μm to about 1 μm, the space 121 of confining air may not be formed.

The embodiment is not limited to the arrangement and the shape of the branch-type patterns 120. For example, the branch-type patterns 120 may be linked with each other.

Figure 9:
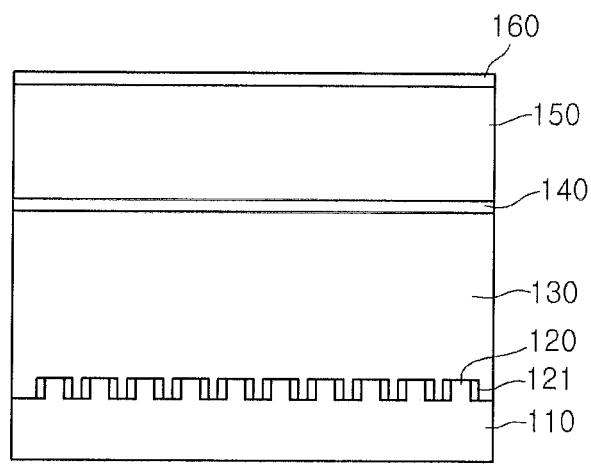

Referring to FIG. 9, the light emitting structure may be formed over the substrate 110 and the branch-type patterns 120. The light emitting structure may include the first semiconductor layer 130, the active layer 140, and the second semiconductor layer 150.

The light emitting structure may be grown through MOCVD, CVD, PECVD, MBE, or HVPE.

The first semiconductor layer 130 may include the first conductive-type semiconductor layer. Meanwhile, the first semiconductor layer 130 includes the first conductive-type semiconductor layer and the non-conductive semiconductor layer under the first conductive-type semiconductor layer, but the embodiment is not limited thereto.

For example, the first conductive-type semiconductor layer may be an N-type semiconductor layer. The N-type semiconductor layer may include a semiconductor material having a composition formula of $In_xAl_yGa_{1-x-y}N$ ($0 \leq x \leq 1$, $0 \leq y \leq 1$, $0 \leq x+y \leq 1$), for example, including one selected from the group consisting of InAlGaN, GaN, AlGaN, InGaN, AlN, InN, and AlInN doped with N-type dopants such as, Si, Ge, or Sn.

Since the non-conductive semiconductor layer is not doped with conductive dopants, the non-conductive semiconductor layer has remarkably low electrical conductivity as compared with the first conductive-type semiconductor layer. For example, the non-conductive semiconductor layer may include an undoped GaN layer, but the embodiment is not limited thereto.

The space 121 may be formed in the branch-type pattern 120 when the light emitting structure is formed. In other words, when the first semiconductor layer 130 is grown on the substrate 110 provided with the branch-type patterns 120, the first semiconductor layer 130 is not formed in the space 121 between the branch-type patterns 120, but air is confined in the space 121. Therefore, the space 121 filled with air may be formed between the branch-type patterns 120 and between the substrate 110 and the first semiconductor layer 130.

In addition, the buffer layer (not shown) may be formed between the first semiconductor layer 130 and the substrate 110 to reduce a lattice constant difference between the first semiconductor layer 130 and the substrate 110.

The active layer 140 may be formed over the first semiconductor layer 130.

The active layer 140 emits a light by the energy band gap difference according to materials constituting the active layer 140 through the combination of electrons (or holes) injected through the first semiconductor layer 130 and holes (or electrons) injected through the second semiconductor layer 150.

The active layer 140 may have a single quantum well structure or a multi-quantum well structure, but the embodiment is not limited thereto.

A clad layer (not shown) doped with N-type dopants or P-type dopants can be formed on and/or under the active layer 140. The clad layer (not shown) may be realized by using an AlGaN layer or an InAlGaN layer.

The second semiconductor layer 150 may be formed over the active layer 140. The second semiconductor layer 150 may include a P-type semiconductor layer including P-type dopants. For instance, the P-type semiconductor layer may include a semiconductor material having the compositional formula of $In_xAl_yGa_{1-x-y}N$ ($0 \leq x \leq 1$, $0 \leq y \leq 1$, $0 \leq x+y \leq 1$). In detail, the P-type semiconductor layer may include one selected from the group consisting of InAlGaN, GaN, AlGaN, InGaN, AlN, InN, and AlInN doped with the P-type dopant such as Mg, Zn, Ca, Sr, or Ba.

Referring to FIG. 1, the transparent electrode layer 160 may be formed over the second semiconductor layer 150. The transparent electrode layer 160 may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au Ni/IrOx/Au/ITO.

The reflective electrode layer (not shown) may be formed over the second semiconductor layer 150 instead of the transparent electrode layer 160. The reflective electrode layer may include at least one selected from the group consisting of Ag, Al, Pt, and Pd representing reflective efficiency.

The first electrode 170 may be formed over the transparent electrode layer 160, and the second electrode 180 may be formed over the first semiconductor layer 130. The first and second electrodes 170 and 180 supply power to the light emitting device 1.

After a mesa etching process may be performed with respect to the light emitting device 1 such that the first semiconductor layer 130 is exposed, the second electrode 180 may be formed over the first semiconductor layer 130.

Figure 10:
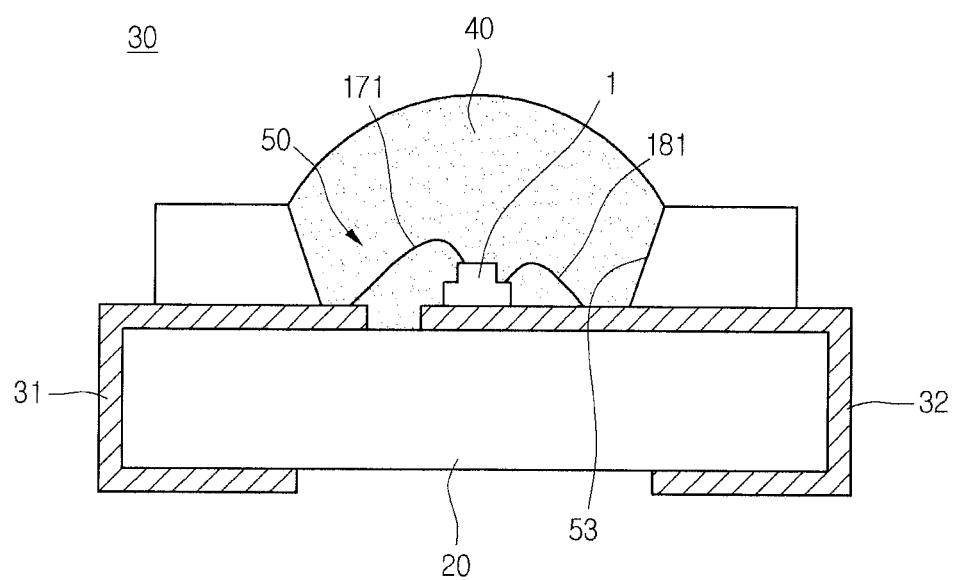
FIG. 10 is a sectional view showing a light emitting device package including the light emitting device according to the embodiment.

FIG. 10 is a sectional view showing a light emitting device package including the light emitting device according to the embodiment.

Referring to FIG. 10, the light emitting device package includes a body 20, first and second electrode layers 31 and 32 formed on the body 20, the light emitting device 1 provided on the body 20 and electrically connected to the first and second electrode layers 31 and 32 and a molding member 40 that surrounds the light emitting device 1.

The body 20 may include silicon, synthetic resin or metallic material. When viewed from the top, the body 20 has a cavity 50 formed with an inclined inner wall 53.

The first and second electrode layers 31 and 32 are electrically isolated from each other and formed by passing through the body 20. In detail, one ends of the first and second electrode layers 31 and 32 are disposed in the cavity 50 and the other ends of the first and second electrode layers 31 and 32 are attached to an outer surface of the body 20 and exposed to the outside.

The first and second electrode layers 31 and 32 supply power to the light emitting device and improve the light efficiency by reflecting the light emitted from the light emitting device 1. Further, the first and second electrode layers 31 and 32 dissipate heat generated from the light emitting device 1 to the outside.

The light emitting device 1 can be installed on the body 20 or the first or second electrode layer 31 or 32.

The wires 171 and 181 of the light emitting device 1 can be electrically connected to one of the first and second electrode layers 31 and 32, but the embodiment is not limited thereto.

The molding member 40 surrounds the light emitting device 1 to protect the light emitting device 1. In addition, the molding member 40 may include phosphors to change the wavelength of the light emitted from the light emitting device 1.

Figure 11:
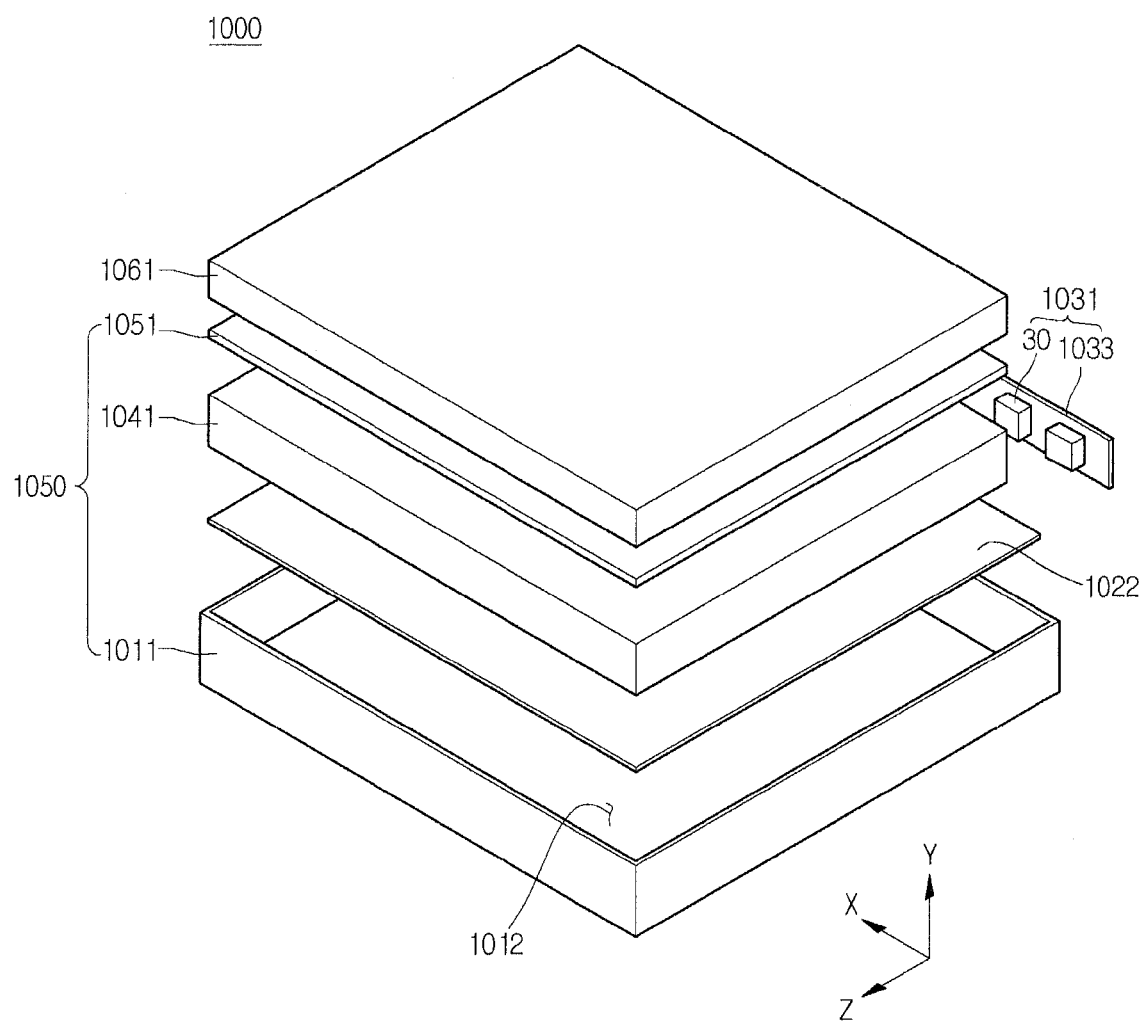
FIG. 11 is an exploded perspective view showing a display device according to the embodiment.
Figure 12:
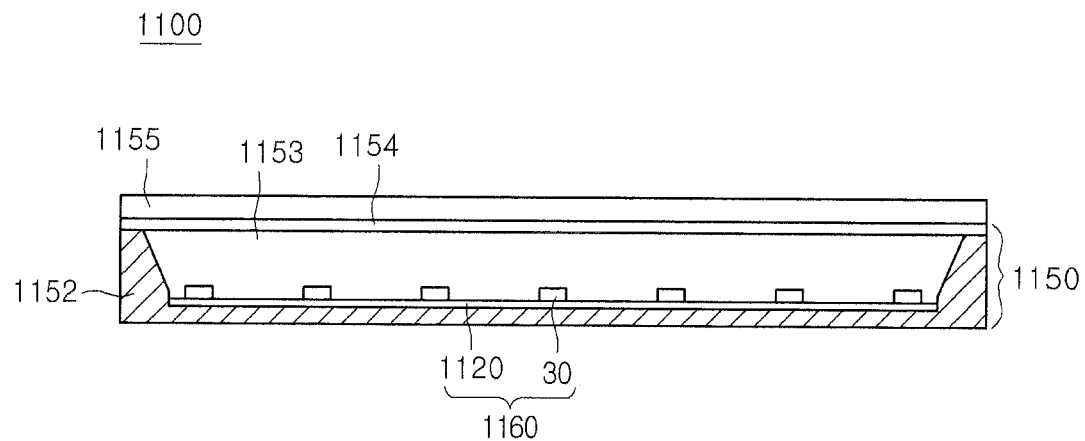
FIG. 12 is a sectional view showing the display device according to the embodiment.
Figure 13:
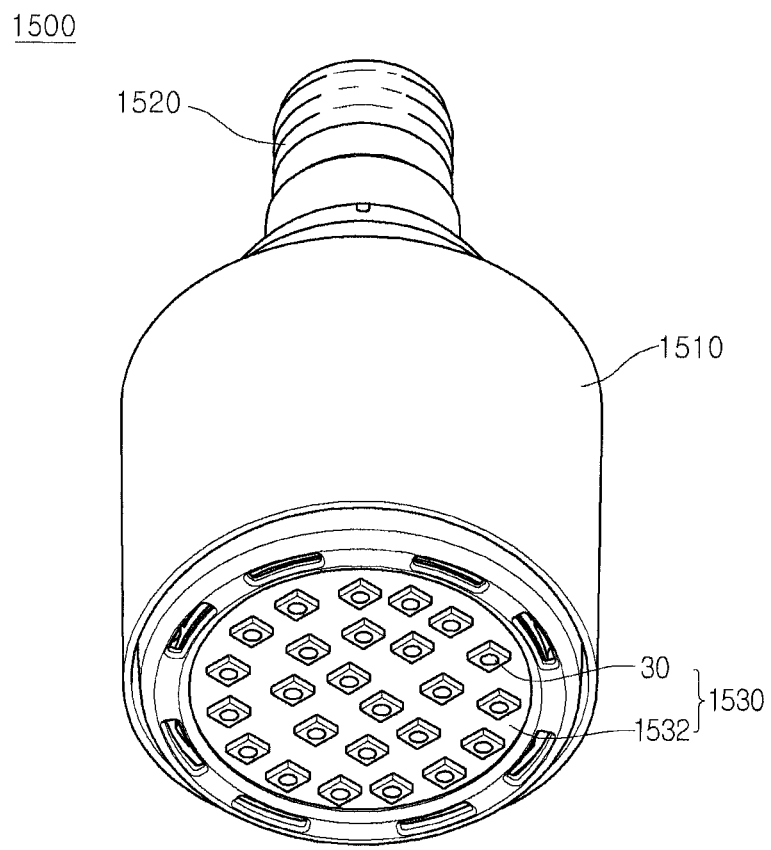
FIG. 13 is a perspective view showing a lighting device according to the embodiment.

The light emitting device or the light emitting device package according to the embodiment can be applied to the light unit. The light unit includes a plurality of light emitting devices or a plurality of light emitting device packages. The light unit may include the display device as shown in FIGS. 11 and 12 and the lighting device as shown in FIG. 13. In addition, the light unit may include a lighting lamp, a signal lamp, a headlight of a vehicle, and an electric signboard.

FIG. 11 is an exploded perspective view showing a display device 1000 according to the embodiment.

Referring to FIG. 11, the display device 1000 includes a light guide plate 1041, a light emitting module 1031 for supplying the light to the light guide plate 1041, a reflective member 1022 provided below the light guide plate 1041, an optical sheet 1051 provided above the light guide plate 1041, a display panel 1061 provided above the optical sheet 1051, and a bottom cover 1011 for receiving the light guide plate 1041, the light emitting module 1031, and the reflective member 1022. However, the embodiment is not limited to the above structure.

The bottom cover 1011, the reflective sheet 1022, the light guide plate 1041 and the optical sheet 1051 may constitute a light unit 1050.

The light guide plate 1041 diffuses the light to provide surface light. The light guide plate 1041 may include transparent material. For instance, the light guide plate 1041 may include one of acryl-based resin, such as PMMA (polymethyl methacrylate, PET (polyethylene terephthalate), PC (polycarbonate), COC (cyclic olefin copolymer) and PEN (polyethylene naphthalate) resin.

The light emitting module 1031 is disposed at one side of the light guide plate 1041 to supply the light to at least one side of the light guide plate 1041. The light emitting module 1031 serves as the light source of the display device.

At least one light emitting module 1031 is provided to directly or indirectly supply the light from one side of the light guide plate 1041. The light emitting module 1031 may include a substrate 1033 and light emitting device packages 30 according to the embodiments. The light emitting device packages 30 are arranged on the substrate 1033 while being spaced apart from each other at the predetermined interval. The substrate 1033 may include a printed circuit board (PCB), but the embodiment is not limited thereto. In addition, the substrate 1033 may also include a metal core PCB (MCPCB) or a flexible PCB (FPCB), but the embodiment is not limited thereto. If the light emitting device packages 30 are installed on the side of the bottom cover 1011 or on a heat dissipation plate, the substrate 1033 may be omitted. The heat dissipation plate partially makes contact with the top surface of the bottom cover 1011. Thus, the heat generated from the light emitting device packages 30 can be emitted to the bottom cover 1011 through the heat dissipation plate.

In addition, the light emitting device packages 30 are arranged such that light exit surfaces of the light emitting device packages 30 are spaced apart from the light guide plate 1041 by a predetermined distance, but the embodiment is not limited thereto. The light emitting device packages 30 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which travels downward through the bottom surface of the light guide plate 1041, toward the display panel 1061, thereby improving the brightness of the display panel 1061. For instance, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for instance, is an LCD panel including first and second transparent substrates, which are opposite to each other, and a liquid crystal layer interposed between the first and second substrates. A polarizing plate can be attached to at least one surface of the display panel 1061, but the embodiment is not limited thereto. The display panel 1061 displays information by blocking the light generated from the light emitting module 1031 or allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For instance, the optical sheet 1051 includes at least one of a diffusion sheet, a horizontal and vertical prism sheet, and a brightness enhanced sheet. The diffusion sheet diffuses the incident light, the horizontal and/or vertical prism sheet concentrates the incident light onto the display panel 1061, and the brightness enhanced sheet improves the brightness by reusing the lost light. In addition, a protective sheet can be provided on the display panel 1061, but the embodiment is not limited thereto.

The light guide plate 1041 and the optical sheet 1051 can be provided in the light path of the light emitting module 1031 as optical members, but the embodiment is not limited thereto.

FIG. 12 is a sectional view showing a display device 1100 according to the embodiment.

Referring to FIG. 12, the display device 1100 includes a bottom cover 1152, a substrate 1120 on which the light emitting device packages 30 are arranged, an optical member 1154, and a display panel 1155.

The substrate 1120 and the light emitting device packages 30 may constitute the light emitting module 1060. In addition, the bottom cover 1152, at least one light emitting module 1060, and the optical member 1154 may constitute the light unit.

The bottom cover 1151 can be provided with a receiving section 1153, but the embodiment is not limited thereto.

The optical member 1154 may include at least one of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto the display panel 1155, and the brightness enhanced sheet improves the brightness by reusing the lost light.

The optical member 1154 is disposed above the light emitting module 1060 in order to convert the light emitted from the light emitting module 1060 into the surface light. In addition, the optical member 1154 may diffuse or collect the light.

FIG. 13 is a perspective view showing a lighting device according to the embodiment.

Referring to FIG. 13, the lighting device 1500 includes a case 1510, a light emitting module 1530 installed in the case 1510, and a connection terminal 1520 installed in the case 1510 to receive power from an external power source.

Preferably, the case 1510 includes material having superior heat dissipation property. For instance, the case 1510 includes metallic material or resin material.

The light emitting module 1530 may include a substrate 1532 and light emitting device packages 30 installed on the substrate 1532. The light emitting device packages 30 are spaced apart from each other or arranged in a matrix shape.

The substrate 1532 includes an insulating member printed with a circuit pattern. For instance, the substrate 1532 includes a PCB, an MCPCB, an FPCB, a ceramic PCB, and an FR-4 substrate.

In addition, the substrate 1532 may include material that effectively reflects the light. A coating layer can be formed on the surface of the substrate 1532. At this time, the coating layer has a white color or a silver color to effectively reflect the light.

At least one light emitting device package 30 is installed on the substrate 1532. Each light emitting device package 30 may include at least one LED (light emitting diode) chip. The LED chip may include an LED that emits the light of visible ray band having red, green, blue or white color and a UV (ultraviolet) LED that emits UV light.

The light emitting device packages 30 of the light emitting module 1530 can be variously arranged to provide various colors and brightness. For instance, the white LED, the red LED and the green LED can be arranged to achieve the high color rendering index (CRI).

The connection terminal 1520 is electrically connected to the light emitting module 1530 to supply power to the light emitting module 1530. The connection terminal 1520 has a shape of a socket screw-coupled with the external power source, but the embodiment is not limited thereto. For instance, the connection terminal 1520 can be prepared in the form of a pin inserted into the external power source or connected to the external power source through a wire.

According to the embodiment, a medium, for example, air having the refractive index different from that of the light emitting structure is filled in the space formed between the patterns of the substrate, thereby reducing a critical angel for total reflection in the space, so that the light emitted from the light emitting structure can be reflected without loss. Therefore, light extraction efficiency can be remarkable improved.

According to the embodiment, the patterns include a plurality of protrusion parts, the protrusion parts protrude in horizontal directions different from each other, and an end portion of each protrusion part has a rounded convex shape. In addition, the width of each protrusion part in the vicinity of a branch point, at which the protrusion parts meet each other, is narrower than the width of end portion of each protrusion part, a plurality of grooves are formed between the protrusion parts, and each groove has a rounded concave shape, so that the space between the patterns can be optimized. Accordingly, the space between the patterns can be optimized, so that light extraction efficiency can be maximized.

According to the embodiment, the patterns are grown from the substrate, so that the complexity in the manufacturing process and the increase of the material cost caused by the separate formation of the patterns can be prevented.

According to the embodiment, the distance of the space formed between the patterns is optimized, so that a cap passage filled with air can be formed.

According to the embodiment, the patterns are arranged in a matrix shape, so that the cap passage formed between the patterns are not locally formed over the substrate, but uniformly formed over the substrate, so that the uniform light extraction efficiency can be obtained throughout the whole region of the light emitting device.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a substrate including a plurality of patterns, each of the plurality of patterns including a plurality of protrusion sections and a plurality of grooves; and
   a light emitting structure over the plurality of patterns and including a first semiconductor layer, an active layer, and a second semiconductor layer, wherein the plurality of protrusion sections extend in different directions and wherein the plurality of grooves are disposed among the plurality of protrusion sections.

2. The light emitting device of claim 1, further comprising a plurality of spaces disposed among the plurality of patterns, wherein one or more of the spaces includes a medium having a refractive index different from a refractive index of the light emitting structure.

3. The light emitting device of claim 1, wherein each pattern includes first to third protrusion sections, and wherein the first to third protrusion sections extend in directions different from each other within one or more horizontal planes.

4. The light emitting device of claim 3, wherein an end portion of each of the first to third protrusion sections has substantially a rounded convex shape.

5. The light emitting device of claim 3, wherein:
   each of the first to third protrusion sections extend from a branch point, each of the first to third protrusion sections has a segment adjacent the branch point and an end at a location different from the branch point, and the segment has at least a width narrower than a width of the end.

6. The light emitting device of claim 3, wherein each groove has substantially a rounded concave shape.

7. The light emitting device of claim 6, wherein angles separate adjacent ones of the first to third protrusion sections and wherein the angles are substantially the same as each other.

8. The light emitting device of claim 7, wherein angles separate adjacent ones of the first to third protrusion sections and wherein the angles are different from each other.

9. The light emitting device of claim 8, wherein the angle between two adjacent protrusion sections is less than or substantially equal to 120°.

10. The light emitting device of claim 1, wherein the plurality of patterns extend from a surface of the substrate in a direction different from the different directions in which the protrusion sections extend.

11. The light emitting device of claim 1, wherein a width of at least one of the grooves is in a range of about 0.1 um to about 1 um.

12. The light emitting device of claim 1, wherein a distance between adjacent ones of the patterns is in a range of about 0.1 um to about 1 um.

13. The light emitting device of claim 1, wherein the plurality of patterns are arranged in substantially a matrix shape or substantially a zigzag shape.

14. The light emitting device of claim 1, wherein the plurality of patterns are arranged in substantially an oblique direction.

15. The light emitting device of claim 1, wherein the plurality of patterns are randomly arranged.

16. The light emitting device of claim 1, wherein heights of the grooves are smaller than or equal to a thickness of one or more of the patterns.

17. The light emitting device of claim 1, further comprising:

a plurality of spaces disposed between the plurality of patterns respectively, wherein one or more of the spaces includes a medium having a refractive index different from a refractive index of the light emitting structure.

18. The light emitting device of claim 1, wherein the different directions extend in one or more planes that are substantially parallel to a direction in which the substrate extends.

19. The light emitting device of claim 18, wherein the one or more planes are horizontal planes.

20. The light emitting device of claim 18, wherein the plurality of protrusion sections extend from the substrate in a direction which crosses said one or more planes.

21. The light emitting device of claim 1, wherein the plurality of protrusion sections extend in substantially a same plane.

22. The light emitting device of claim 2, wherein the medium is air.

23. The light emitting device of claim 17 wherein at least one of the plurality of spaces includes one of the grooves.

24. The light emitting device of claim 1, wherein at least one of the plurality of protrusion sections from one of the plurality of patterns is disposed in opposing relation to one of the grooves in another one of the plurality of patterns.

25. A light emitting device comprising:

a substrate; and a plurality of patterns arranged over the substrate, wherein each of the plurality of patterns comprises:

a plurality of protrusion sections that extend in different directions, a plurality of spaces formed among the plurality of patterns; and a light emitting structure disposed over the substrate and including a first semiconductor layer, an active layer, and a second semiconductor layer, wherein the light emitting structure is disposed over the plurality of patterns and the plurality of spaces, wherein each of the plurality of spaces includes a medium having a refractive index different from a refractive index of the light emitting structure, and wherein at least one of the plurality of spaces is formed between one protrusion section of one of the plurality of patterns and two protrusion sections of another one of the plurality of patterns.

26. A light emitting device package comprising:

a body;

first and second electrode layers over the body;

a light emitting device electrically connected to the first and second electrode layers over the body; and a molding material surrounding the light emitting device over the body, wherein each light emitting device comprises:

a plurality of patterns, each of the plurality of patterns including a plurality of protrusion sections that extend in different directions and a plurality of grooves among the plurality of protrusion sections;

a plurality of spaces formed among the plurality of patterns; and a light emitting structure disposed over the plurality of patterns and the plurality of spaces and including a first semiconductor layer, an active layer, and a second semiconductor layer, and wherein one or more of the plurality of spaces includes a medium having a refractive index different from a refractive index of the light emitting structure.

* * * * *